United States Patent
Mann et al.

(10) Patent No.: US 7,982,854 B2
(45) Date of Patent: Jul. 19, 2011

(54) PROJECTION EXPOSURE SYSTEM, METHOD FOR MANUFACTURING A MICRO-STRUCTURED STRUCTURAL MEMBER BY THE AID OF SUCH A PROJECTION EXPOSURE SYSTEM AND POLARIZATION-OPTICAL ELEMENT ADAPTED FOR USE IN SUCH A SYSTEM

(75) Inventors: Hans-Juergen Mann, Oberkochen (DE); Wolfgang Singer, Aalen (DE); Toralf Gruner, Aalen-Hofen (DE); Olaf Dittmann, Bopfingen (DE); Michael Totzeck, Gmuend (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 594 days.

(21) Appl. No.: 11/911,454

(22) PCT Filed: Apr. 12, 2006

(86) PCT No.: PCT/EP2006/003401
§ 371 (c)(1),
(2), (4) Date: Oct. 12, 2007

(87) PCT Pub. No.: WO2006/111319
PCT Pub. Date: Oct. 26, 2006

(65) Prior Publication Data
US 2008/0192225 A1   Aug. 14, 2008

Related U.S. Application Data

(60) Provisional application No. 60/673,638, filed on Apr. 20, 2005.

(51) Int. Cl.
*G03B 27/72* (2006.01)
*G03B 27/54* (2006.01)
(52) U.S. Cl. ............................................. 355/71; 355/67
(58) Field of Classification Search .................... 355/52, 355/53, 55, 67, 71; 359/437, 487
See application file for complete search history.

(56) References Cited

U.S. PATENT DOCUMENTS

| 4,393,127 A | 7/1983 | Greschner et al. |
| 4,870,648 A | 9/1989 | Ceglio et al. |
| 5,382,999 A | 1/1995 | Kamon |

(Continued)

FOREIGN PATENT DOCUMENTS

DE    103 27 963    1/2005

(Continued)

OTHER PUBLICATIONS

F. Delmotte et al., "X-ray-ultraviolet bam splitters for the Michelson interferometer," Applied Optics, vol. 41, No. 28, Oct. 1, 2002, pp. 5905-5912.

(Continued)

*Primary Examiner* — Hung Henry Nguyen
(74) *Attorney, Agent, or Firm* — Fish & Richardson P.C.

(57) ABSTRACT

The invention relates to a projection exposure system, in particular for micro-lithography. The projection exposure system according to the invention comprises a light source for producing light in the EUV region. The projection exposure system further comprises a first optical system for illuminating a mask by the light of the light source and a second optical system for imaging the mask on a component. At least one polarization-optical element is disposed on the beam path between the light source and the component.

12 Claims, 5 Drawing Sheets

U.S. PATENT DOCUMENTS

| | | |
|---|---|---|
| 6,353,470 B1 | 3/2002 | Dinger |
| 6,438,199 B1 | 8/2002 | Schultz et al. |
| 7,090,964 B2 * | 8/2006 | Baba-Ali et al. ............... 430/311 |
| 7,408,616 B2 * | 8/2008 | Gruner et al. .................... 355/53 |
| 2002/0176166 A1 | 11/2002 | Schuster |
| 2003/0043455 A1 | 3/2003 | Singer et al. |
| 2003/0142322 A1 | 7/2003 | Sato |
| 2003/0234348 A1 * | 12/2003 | Takeuchi et al. ............... 250/225 |
| 2004/0169924 A1 | 9/2004 | Flagello et al. |
| 2004/0184019 A1 | 9/2004 | Totzeck et al. |
| 2004/0263974 A1 * | 12/2004 | McDonough et al. ........ 359/487 |

FOREIGN PATENT DOCUMENTS

| | | |
|---|---|---|
| EP | 0 048 291 | 3/1982 |
| EP | 1 306 665 | 5/2003 |
| JP | 03 196000 | 8/1991 |

OTHER PUBLICATIONS

B. Kjomrattanawanich et al., "Mo/$B_4$C/Si multiplayer-coated photodiode with polarization sensitivity at an extreme-ultraviolet wavelength of 13.5 nm," Applied Optics, vol. 43, No. 5, Feb. 10, 2004, pp. 1082-1090.

* cited by examiner

US 7,982,854 B2

PROJECTION EXPOSURE SYSTEM, METHOD FOR MANUFACTURING A MICRO-STRUCTURED STRUCTURAL MEMBER BY THE AID OF SUCH A PROJECTION EXPOSURE SYSTEM AND POLARIZATION-OPTICAL ELEMENT ADAPTED FOR USE IN SUCH A SYSTEM

CROSS-REFERENCE TO RELATED APPLICATIONS

This application is a National Phase application under 35 U.S.C. §371 filed from International Patent Application Serial No. PCT/EP2006/003401, filed on Apr. 12, 2006, which claims priority to U.S. Provisional Application Ser. No. 60/673,638, filed Apr. 20, 2005.

FIELD

The invention relates to a projection exposure system, in particular for micro-lithography. The invention further relates to a method for manufacturing a micro-structured component and a polarization-optical element for the extreme ultraviolet (EUV) region.

For highest possible precision of the optical image to be obtained in complicated optical instruments such as a projection exposure system, the influence of the polarization of the light must be considered or, respectively, the polarization must be influenced specifically. For example, in particular in case of great incidence angles, polarization effects occur in the mirror systems, which projection exposure systems in the EUV region are based on, for lack of suitable transparent materials. These polarization effects are in particular due to the varying reflectivity of the mirrors for s-polarized and p-polarized light and can give rise to imaging errors or other undesired effects. Efforts have been made to measure possible polarization effects in the individual components of projection exposure systems.

BACKGROUND

For example, EP 1 306 665 A2 discloses an optical instrument for measuring polarization-dependent properties which comprises a light source in the EUV or X-radiation region and a rotatable polarizer. The polarizer is substantially comprised of a set of mirrors that reflects the incident light at least three times. The mirrors are arranged in such a way that the optical axes of the incident and emergent light are on the same straight line.

A beam splitter is among other things known from US 2003/0142322 A1; it splits light in the EUV region by means of a diffraction grating into transmitted light and reflected light, the transmitted and the reflected light being polarized orthogonally.

SUMMARY

It is an object of the invention to ensure as precise as possible an image by light in the EUV region, in particular in a projection exposure system of micro-lithography.

This object is attained by a projection exposure system, in particular for micro-lithography, comprising a light source for producing light in the EUV region; a first optical system for illuminating a mask by the light of the light source; a second optical system for imaging the mask on a structural member; wherein at least one polarization-optical element for the EUV region is disposed on the beam path between the light source and the structural member, said at least one polarization-optical element comprising at least one reflective cone surface, having a polarizing effect for the light produced by said light source. This object is also attained by a projection exposure system, in particular for micro-lithography, comprising a light source for producing light in the EUV region; a first optical system for illuminating a mask by the light of the light source; and a second optical system for imaging the mask on a structural member; wherein at least one polarization-optical element for the EUV region is disposed on the beam path between the light source and the structural member, said at least one polarization-optical element having a substrate being at least partially transparent for a first polarization state of the EUV light being incident under a given angle of inclination $\alpha$, having a layer structure which is arranged on the substrate and which is reflective for a second polarization state of the EUV light.

The polarization-optical element according to the invention may be used for polarization of initially unpolarized EUV light or may be used for correction of the polarization states of polarized EUV light. The invention has the advantage that a desired polarization state can be produced or that undesired polarization effects can be corrected, imaging errors thus being reduced.

The projection exposure system according to a first aspect of the invention, in particular for micro-lithography, comprises a light source for producing light in the EUV region, a first optical system for illuminating a mask by the light of the light source and a second optical system for imaging the mask on a component. At least one polarization-optical element is disposed on the beam path between the light source and the structural member. This at least one polarization-optical element comprises at least one reflective cone surface having a polarizing effect for the light produced by said light source. With such a cone or conical surface, tangential polarization can be produced especially easily. In case of tangential polarization, several regions are formed which are linearly polarized in various directions over the cross-section of the light beam and which deviate by maximally 10° from a tangential orientation in relation to a radius vector set to the optical axis. Advantageously, the polarization-optical element comprises at least one cone element having an outer surface being reflective for at least a given polarization component of the EUV light being incident under an angle of inclination $\alpha$ to the axis of rotational symmetry of the cone surface in a region of inclination angles $\alpha$ between 0° and a maximum angle of inclination such that the cone surface has a polarizing effect, the polarization-optical element having at least another component for the EUV light to bundle the EUV light being reflected from the outer cone surface of the cone element. The other component is preferably disposed downstream of the outer cone surface on the beam path and may for example be an inner surface of a cylinder. Advantageously the whole polarization-optical element is rotationally symmetric.

Advantageously, the polarization-optical element comprises at least one further cone element having an outer cone surface being reflective for at least a given polarization component of the EUV-light being incident under an angle of inclination $\alpha$ to the axis of rotational symmetry of the cone surface of the further cone element in a region of inclination angles between 0° and a maximum angle of inclination, wherein base regions of both cone elements are faced towards each other and wherein the axes of rotational symmetry of both cone surfaces coincide. This offers a simple way of configuring the beam path within the polarization-optical element according to the invention. For example, the inner surface of a cylinder can be disposed on the beam path between the two outer cone surfaces.

The at least one further component for bundling the EUV light being reflected from the outer cone surface is advantageously formed as a hollow cylinder, whose inner surface is reflective and is arranged such that the axis of rotational symmetry of the hollow cylinder coincides with that of the at least one cone element. With such an arrangement a defined geometrically conditioned change in the intensity distribution of the EUV light beam when it passes through the polarization-optical element according to the invention is possible.

As an alternative to a hollow cylinder, the at least one further reflective component of the at least one polarization-optical element has two inner cone surfaces being reflective for at least a given polarization component of the EUV light being incident under an angle of inclination to the axis of rotational symmetry of the cone surfaces in a region of inclination angles between 0° and a maximum angle of inclination, wherein both inner cone surfaces are faced towards each other, and wherein the axes of rotational symmetry of both inner cone surfaces coincide, and wherein the conical surfaces, i.e. the inner conical surfaces and the outer conical surfaces of the respective cone elements, are arranged such that incident EUV light is reflected at first by the polarizing outer cone surface, then subsequently by both inner cone surfaces and then by the further outer cone surface. With such an arrangement, there is no geometrically conditioned changed in the distribution of intensity of the light beam when it passes through the polarization-optical element according to the invention. Moreover, this arrangement offers a possibility of implementation in which an axially parallel incident light beam is emitted axially parallel by the polarization-optical element according to the invention. On the whole, the polarization-optical element according to the invention for the EUV region can be put into a compact structure by provision of two reflective outer cone surfaces and two reflective inner cone surfaces which surround the outer cone surfaces at a distance. At least one of the outer cone surfaces or inner cone surfaces has a polarizing effect.

The outer cone surfaces and the inner cone surfaces of the polarization-optical element preferably have the same cone angle. This leads to a simple and easy to adjust geometry of the EUV light beam within the polarization-optical element.

Advantageously, the cone angle of the polarization-optical element is 45°. Single EUV light rays are then reflected with an angle of 90° between the incoming and the reflected ray. This facilitates the adjustment of the EUV light beam.

The projection exposure system according to a second aspect of the invention, in particular for micro-lithography, comprises a light source for producing light in the EUV region, a first optical system for illuminating a mask by the light of the light source and a second optical system for imaging the mask on a structural member, wherein at least one polarization-optical element for the EUV region is disposed on the beam path between the light source and the structural member, said at least one polarization-optical element having a substrate being at least partially transparent for a first polarization state of the EUV light being incident under a given angle of inclination, the at least one polarization-optical element further having a layer structure which is arranged on the substrate and which is reflective for a second polarization state of the EUV light. Such a polarization-optical element serves as a polarization dependent beam splitter which may be used for a defined division of an incoming EUV light beam comprising both polarization states. By respective dimensioning of the layer structure, in particular the thicknesses of layers, an adaption to the envisaged kind of use is possible, in particular with a view to the wave-length of the light and the occurring incidence angles.

The substrate and the layer structure of the polarization-optical element are preferably arranged such that they have their transparent and reflective optical effect at an angle of inclination of the EUV light of approximately 45°. Such a polarization-optical element facilitates the adjustment of the EUV light beam.

The substrate of the polarization-optical element preferably has a thickness of less than 1 µm. Advantageously, this substrate is a silicon substrate. Such a substrate exhibits a high transmission even in the EUV region.

The substrate of the polarization-optical element preferably is disposed on a regionally perforated carrier structure of higher mechanical stability than the substrate. Such a perforation can be done by provision of a plurality of through-holes in the substrate. Such a carrier structure gives mechanical strength to the polarization-optical system even in cases where the substrate itself has practically no mechanical stability.

Advantageously, the layer structure of the polarization-optical element according to the second aspect of the invention comprises alternately successive molybdenum layers and silicon layers. Such a layer structure gives a good reflectivity of the polarization-optical element with regard to the second polarization state.

The layer structure preferably has a plurality of alternately successive layers. Such a layer structure gives the possibility of high transmission of the first polarization state on the one hand and high reflection of the second polarization state on the other due to interference effects.

The polarization-optical element with such alternately successive layers comprises preferably less than 80 successive layers. Advantageously, approximately 40 layers are present. Such a number of layer structures gives a good reflectivity for the second polarization state. However, the overall layer structure is sufficiently thin to still give a fair transmission even in the EUV region.

Advantageously, the layer thickness of the molybdenum layers of the polarization-optical element is 2.478 mm/cos $\alpha$ and the layer thickness of the silicon layers of the polarization-optical element is 4.406 nm/cos $\alpha$. This gives a good transmission for the first polarization state and a good reflectivity for the second polarization state regarding a EUV target wavelength of 13.5 nm.

The polarization-optical element preferably is arranged such that the intensity of the transmitted fraction of the EUV light amounts to at least 10% of the intensity of the reflected fraction. This leads to efficiently splitting of the EUV light beam via the polarization-optical element.

Preferably, the polarization-optical element is arranged such that the intensity of the transmitted fraction of the EUV light amounts to at least 15% or even to at least 20% of the intensity of the reflected fraction.

Advantageously, the layer structure of the polarization-optical element has at least one none-uniform thick layer. In addition or as an alternative, at least one of the layers of the layer structure of the polarization-optical element preferably has a surface that is exposed to the EUV light beam, which surface comprises several partial surfaces which are inclined to each other. As a rule, the polarization state of the light beam depends, among other things, on the incidence angle by which the light beam strikes the component of the polarization-optical element. An effect, varying over the cross-section of the light beam, on the respective polarization state of the light beam can thus be accomplished simply by a surface having different inclinations to the light beam over its cross-section. In this way, the desired polarization distribution can be produced by a corresponding geometric design of the component.

In the method according to the invention for the manufacture of a micro-structured component, a projection exposure system is operated at least sectionally by polarized light in the EUV region, a mask being imaged on a light-sensitive coating of the component.

The method according to the invention can also be configured such that, by the aid of a projection exposure system operating in the EUV region, a mask is imaged on a light-sensitive coating of the component and the polarization state of the light used therefor is corrected.

Both methods according to the invention give the possibility to reduce imaging errors and therefore give the possibility to produce structures having a high resolution.

The invention further relates to a polarization-optical element for the EUV region being adapted to operate in a projection exposure system according to the invention. The advantages of this polarization-optical element correspond to those mentioned above with respect to the projection exposure system according to the invention.

An advantage of the polarization-optical element according to the invention resides in that undesired polarization effects can be corrected even when due to inhomogeneous polarization distribution over the cross section of the beam of light. Another advantage resides in that inhomogeneous polarization distribution over the cross section of the light beam can be produced deliberately by the polarization-optical element according to the invention. This can have a rather positive effect on the illuminating and imaging properties of the beam of light thus modified.

The invention also relates to a polarization-optical element for the EUV region having at least one component which, in case of a light beam spatially extended crosswise of the direction of propagation, produces a polarization distribution inhomogeneous over the cross section of the light beam.

The polarization-optical element according to the invention can be designed such that, even in case of a substantially parallel light beam, the influence of the component on the polarization state of the light beam varies over the cross section of the light beam.

Preferably, the polarization-optical element according to the invention is configured such that this applies also in case of a light beam with a divergence of less than 5°.

By the polarization-optical element according to the invention, tangential polarization can for example be produced, in which several regions are formed which are linearly polarized in various directions and which deviate by a maximum of 10° from a tangential orientation in relation to a radius vector set to the optical axis.

The polarization-optical element according to the invention can be constructed in such a way that the component influences the amplitude of the polarization fractions that are contained in the polarization state.

It is also possible to affect the phase relation between the polarization fractions that are contained in the polarization state. A joint influence on the amplitude and phase is conceivable too and can frequently be implemented more easily than selective influence.

In this case, the polarization-optical element according to the invention is preferably rotationally symmetrical.

The invention further relates to a polarization-optical element for the EUV region in the form of a retardation element which, upon light incidence, emits transmitted light with a first polarization fraction and a second polarization fraction. The quotient of the intensities of the two polarization fractions ranges between 0.3 and 3. The phase difference of the two polarization fractions ranges between one and seven eighths of the wavelength of the incident light.

Details of the invention will become apparent from the ensuing description of exemplary embodiments, taken in conjunction with the drawing, in which

DETAILED DESCRIPTION

Figure 1:
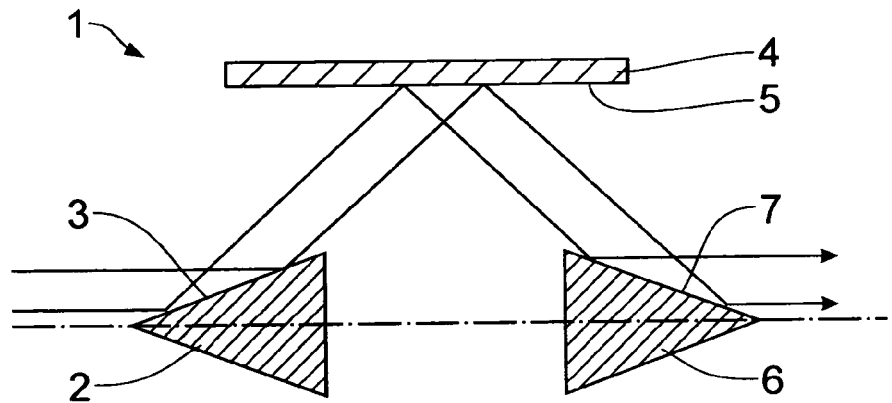
FIG. 1 is a diagrammatic illustration of a meridional section of a first embodiment of a polarization-optical element according to the invention for the EUV region.

FIG. 1 shows a diagrammatic illustration of a meridional section of a first embodiment of a polarization-optical element 1 according to the invention for the EUV region. The EUV region comprises wavelengths in the range of the extreme ultraviolet light and soft X-radiation, in particular below 100 nm, with wavelengths of between 5 nm and 30 nm being of special importance. The following considerations proceed from a wavelength of 13.5 nm by way of example, which is of decisive importance for EUV lithography because suitable light sources are available. However, the invention is not restricted to this wavelength.

In the first embodiment, the polarization-optical element 1 is a rotationally symmetrical mirror arrangement of a first cone 2 with a reflective outer surface 3, a hollow cylinder 4 and a reflective inner surface 5 and a second cone 6 with a reflective outer surface 7. The two cones 2 and 6 are successively disposed at a distance from each other on a line, with the basis of the first cone 2 and the basis of the second cone 6 neighboring. The hollow cylinder 4 is coaxial of the two cones 2 and 6. Correspondingly, the incident light is reflected from the outer surface 3 of the first cone 2 to the inner surface 5 of the hollow cylinder 4 and from there to the outer surface 7 of the second cone 6. After reflection on the outer surface 7 of the second cone 6, the light leaves the mirror arrangement.

As explained in detail in the following, the mirror arrangement of FIG. 1 serves to reflect almost exclusively the fraction of the light which is polarized vertically to the plane of incidence and which is also called s-polarized. Owing to the rotational symmetry of the mirror arrangement, this leads to tangential polarization of the light. Tangential polarization is to be understood as a polarization distribution which comprises linearly polarized light of various polarization directions which are each tangential to the radius vector to the optical axis. In this case, the maximal deviation of the polarization direction from the tangential orientation amounts to 10%. The polarization-dependent reflection is caused by the layer structure seen in FIG. 2 which is applied to at least one of the reflective surfaces 3, 5 and 7.

The mirror arrangement seen in FIG. 1 moreover affects the intensity distribution within the light beam, because the tip of the first cone 2 is imaged on an area, near the base, of the second cone 6 and the area, near the base, of the first cone 2 is imaged on the tip of the second cone 6. This leads to a shift of intensity from the outer area to the center of the light beam.

Producing the described polarization distribution and the described intensity distribution do not require any divergence of the light beam, therefore occurring even in case of inferior divergence of, for example, less than 5° or in case of a parallel light beam.

Figure 2:
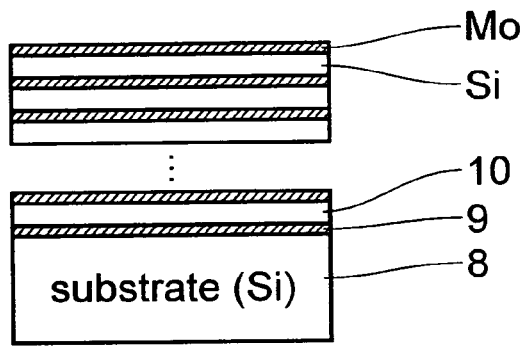
FIG. 2 is a diagrammatic illustration of an embodiment of a layer structure for polarization-dependent reflection.

FIG. 2 is a diagrammatic illustration of an embodiment of a layer structure for polarization-dependent reflection. Molybdenum layers 9 and silicon layers 10 are alternately applied to a silicon substrate 8. A layer structure of, for example, a total of 80 layers is constructed in this way. For a wavelength of 13.5 nm, the layer thickness of the molybdenum layers 9 amounts to 2.478 nm/cos α, α representing the provided angle of incidence of the light related to the surface normal of the layer structure. The thickness of the silicon layers 10 is 4.406 nm/cos α. The refraction index of molybdenum is 0.92125163+i*0.00641431. The refraction index of silicon is 0.99936237+i*0.00171609. A reflectivity curve of the layer structure of FIG. 2 is shown in FIG. 3.

Figure 3:
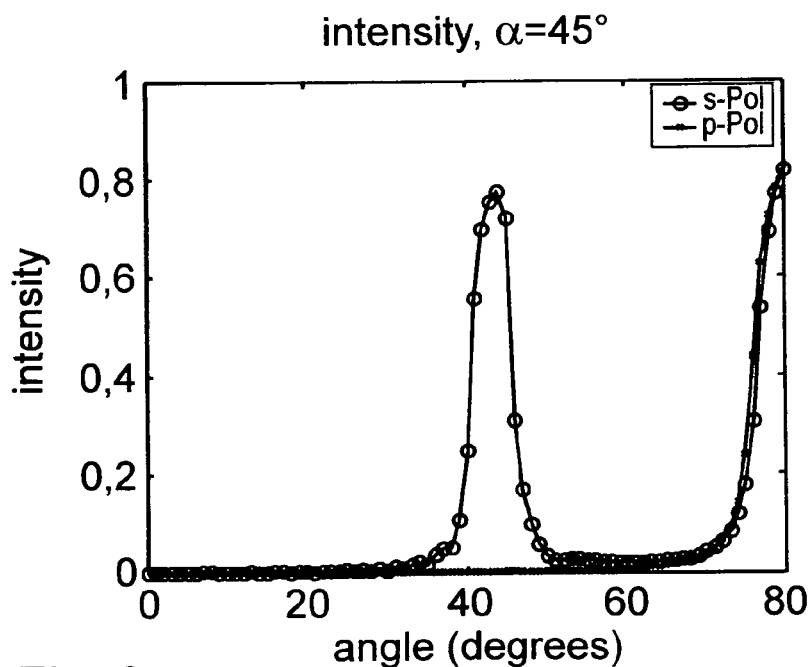
FIG. 3 is a diagram showing the angular dependency of the reflected intensity for the layer structure seen in FIG. 2.

FIG. 3 is a diagram showing the angular dependency of the reflected intensity for the layer structure seen in FIG. 2. Plotted on the abscissa is the amount of the angle which is made by the incident and also mirrored beam and the surface normal. The intensity of the reflected beam is plotted on the ordinate. The thicknesses of the molybdenum layers 9 and of the silicon layers 10 were determined on the basis of an incidence angle of α=45°. A course of a curve marked by circles is shown for the s-polarized fraction of the reflected beam and a course of a curve marked by crosses for the p-polarized fraction. The courses were determined by calculation. The s-polarized fraction possesses an intensity maximum at an angle of 45°. The intensity of the p-polarized fraction is nearly zero at an angle of 45°. This means that, given an incidence angle of 45°, it is almost exclusively the s-polarized fraction of the light beam that is mirrored by the layer structure of FIG. 2.

Figure 4:
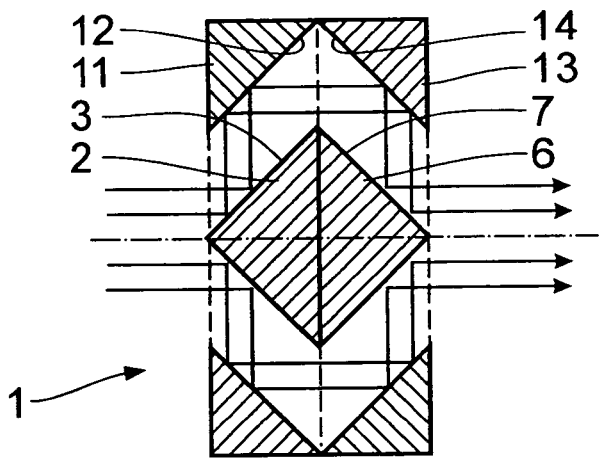
FIG. 4 is an illustration, corresponding to FIG. 1, of a second embodiment of the polarization-optical element according to the invention.

FIG. 4 is an illustration, corresponding to FIG. 1, of a second embodiment of the polarization-optical element 1 according to the invention. In the second embodiment, the polarization-optical element 1 is again a rotationally symmetrical mirror arrangement comprising the two cones 2 and 6. By contrast to the first embodiment, the two cones 2 and 6 are not spaced apart but bear against each other by their base. Moreover, the cone angles of the cone 2 and 6 of the second embodiment are greater than in the first embodiment, amounting to 90°. Instead of the hollow cylinder 4, the second embodiment provides a first internal cone 11 with an inner surface 12 and a second internal cone 13 with an inner surface 14 i.e., two solids of rotation with cone inner surfaces 12 and 14. The internal cones 11 and 13 touch each other in the vicinity of their maximum inside diameter and are concentric of the cones 2 and 6.

An incident light beam is successively reflected on the outer surface 3 of the first cone 2, on the inner surface 12 of the first internal cone 11, on the inner surface 14 of the second internal cone 13 and on the outer surface 7 of the second cone 6. As explained in connection with the first embodiment, this leads again to tangential polarization. However, as opposed to the first embodiment, no inhomogeneous illumination is produced, because the tip of the first cone 2 is imaged on the tip of the second cone 6. Moreover, in the second embodiment, the angle by which the light beams, in the meridional plane, are incident into the mirror arrangement can be found again when the beams are emergent from the mirror arrangement. This is illustrated in FIG. 5.

Figure 5:
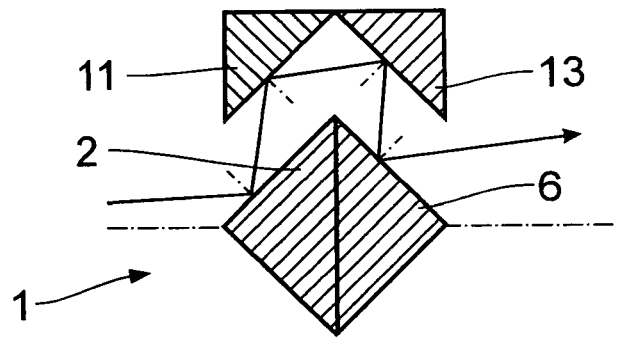
FIG. 5 is a view of the embodiment of FIG. 4 with another beam path.

FIG. 5 shows the embodiment of FIG. 4 with another beam path. As opposed to FIG. 4, the incident beam and the axis of rotation of the polarization-optical element 1 make an angle. After passing the polarization-optical element 1, the emergent beam has the same angle to the axis of rotation. This means that the second embodiment of the polarization-optical element 1 does not modify the divergence of a light beam.

Figure 6:
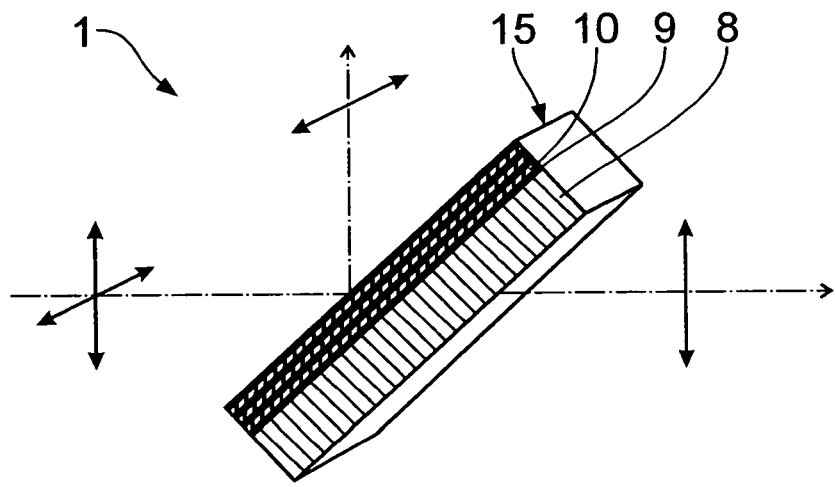
FIG. 6 is a perspective view of a third embodiment of the polarization-optical element according to the invention.
Figure 7:
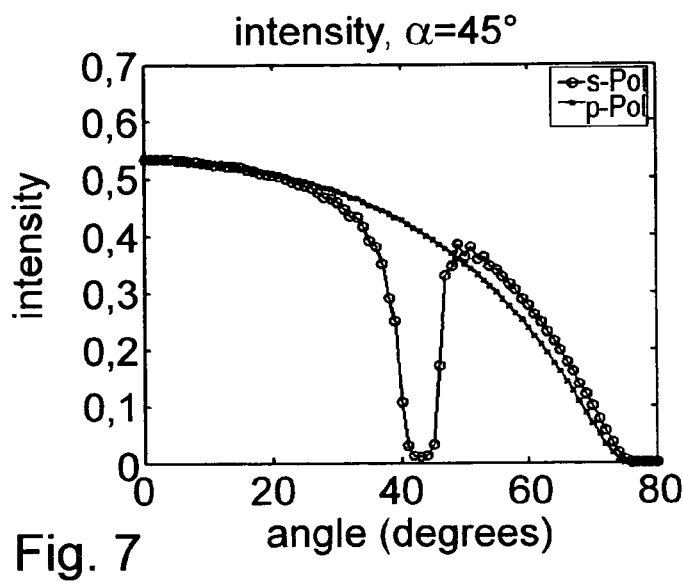
FIG. 7 is a diagram showing the angular dependency of the transmitted intensity for the fourth embodiment of the polarization-optical element seen in FIG. 6.
Figure 8:
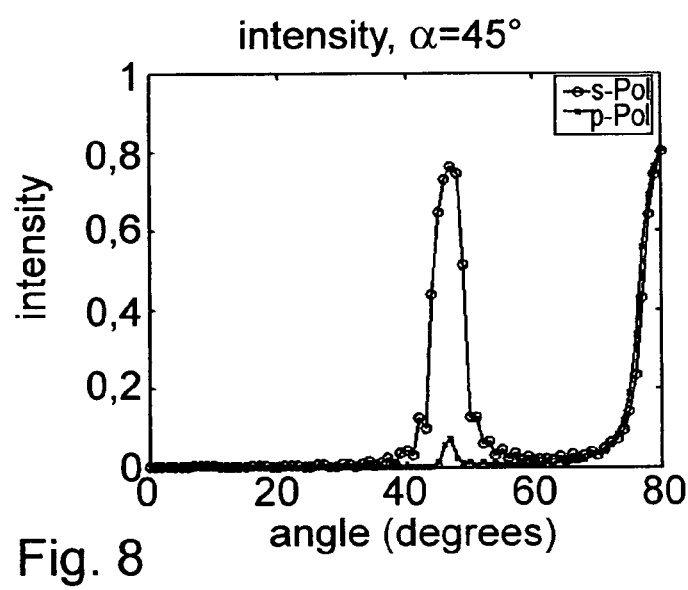
FIG. 8 is a diagram showing the angular dependency of the reflected intensity for the fourth embodiment of the polarization-optical element seen in FIG. 6.

FIG. 6 illustrates a third embodiment of the polarization-optical element 1 in a perspective view. In the third embodiment, the polarization-optical element 1 comprises only one mirror 15 which is a thin plane mirror oriented by 45° to the direction of incidence, which corresponds approximately to the Brewster angle, given the prevailing conditions. The mirror 15 comprises a silicon substrate 8 of a maximal thickness of approximately 1 μm. With a thickness like that, the silicon substrate 8 still exhibits sufficient transmission for a wavelength of 13.5 nm. For mechanical stabilization, the silicon substrate 8 can be disposed on a wire lattice (not shown). Similarly to what is seen in FIG. 2, molybdenum layers 9 and silicon layers 10 are alternately applied to the silicon substrate 8. A total of less than 80, preferably approximately 40 layers, are applied. The parameters can be identical with those mentioned in connection with FIG. 2. Because of the polarization-dependent reflection and transmission behavior of this layer structure, which is illustrated in FIGS. 7 and 8, an s-polarized, mirrored beam is produced from an unpolarized, incident beam on the one hand and a p-polarized, transmitted beam on the other. With the refraction index of the mirror 15 for the EUV region being close to a value of 1, the transmitted beam is hardly deviated as compared to the direction of the incident beam. The mirror 15 seen in FIG. 5 works as a polarizing beam splitter.

FIG. 7 is a diagram showing the angular dependency of the transmitted intensity for the fourth embodiment of the polarization-optical element 1 of FIG. 6. An associated diagram showing the reflected intensity is illustrated in FIG. 8. The way of illustration corresponds to that of FIG. 3. Again an incidence angle of α=45° was chosen as a parameter for the layer structure. As seen in FIG. 7, the s-polarized fraction of the transmitted beam possesses a distinct minimum at an angle to the surface normal of 45°, the intensity decreasing to near zero. The p-polarized fraction does not drop at 45°, therefore having a many times higher intensity than the s-polarized fraction in the vicinity of 45°.

As seen in FIG. 8, reverse behavior can be observed for the reflected beam. The s-polarized fraction of the reflected beam possesses a pronounced maximum at an angle of 45°. The p-polarized fraction also has a maximum at 45°, but that is very weak as compared to the s-polarized fraction. The overall result is that, in an angular range of 5° around the angle of 45°, the transmitted beam is p-polarized and the reflected beam s-polarized. In this case, the parameters are selected such that the intensity of the transmitted beam amounts to at least 10% of the intensity of the reflected beam. Preferably, the portion of the transmitted intensity ranges above 15%, possibly even above 20%.

Figure 9:
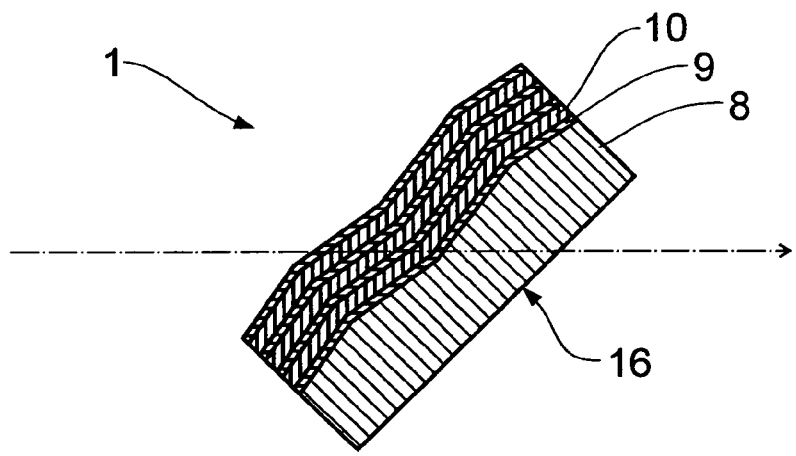
FIG. 9 is a view, corresponding to FIG. 1, of a fourth embodiment of the polarization-optical element according to the invention.

FIG. 9 is an illustration, corresponding to FIG. 1, of a fourth embodiment of a polarization-optical element 1 according to the invention. In the fourth embodiment, the polarization-optical element 1 is a mirror 16, the surface normal of which and the direction of incidence of the light making an angle of, for example, 40°. Since the mirror 16 is not plane, the incidence angle of 40° is a mean value of the various incidence angles of the existing partial surfaces. The mirror 16 comprises a thin silicon substrate 8 of a surface that is not plane and to which molybdenum layers 9 and silicon layers 10 are applied alternately. The applied layers 9 and 10 have a uniform thickness so that the structure of the substrate surface continues in the layers 9 and 10. As will become apparent in detail from FIGS. 10 and 11, the s-polarized and the p-polarized fraction of the transmitted beam not only have an angle-dependent difference of intensity, but also an angle-dependent difference of phase. Consequently, the differently oriented partial surfaces of the mirror 16 produce varying differences of phase between the s-polarization and the p-polarization of the transmitted beam. If a light beam that is spatially extended crosswise of its direction of propagation strikes the mirror 16, differently oriented partial surfaces of the mirror 16 are illuminated. Correspondingly, the differences of phase between the s-polarization and the p-polarization are differently influenced for the respectively associated cross-sectional areas of the light beam. Thus the arrangement of the partial surfaces of the mirror 16 has a corresponding distribution of ranges of phase difference in the cross section of the light beam. This means that, by corresponding orientation of the partial surfaces of the mirror 16, a desired, in particular inhomogeneous, distribution of the difference of phase can be produced and undesired distribution can be compensated. Therefore, the fourth embodiment, seen in FIG. 9, of the polarization-optical element 1 is a space-variant retardation element or a space-variant retarder, respectively.

Figure 10:
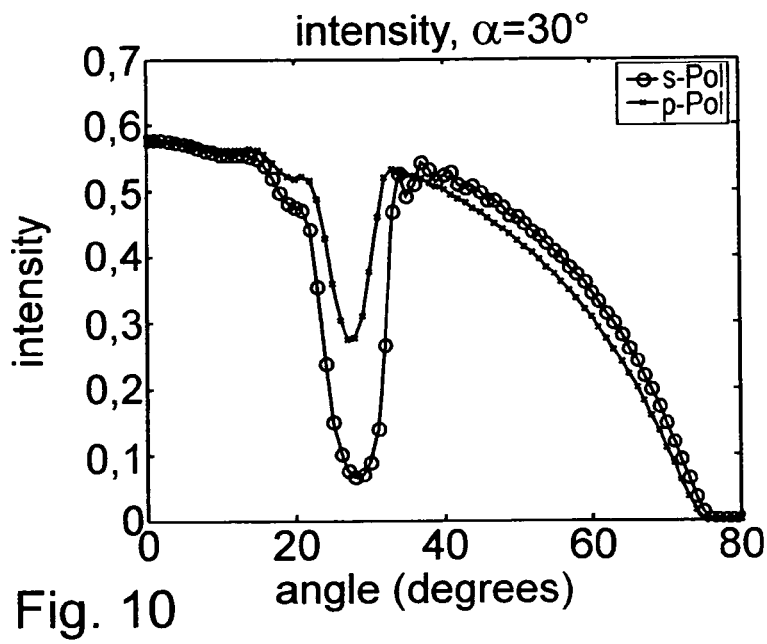
FIG. 10 is a diagram showing the angular dependency of the transmitted intensity for the fourth embodiment of the polarization-optical element seen in FIG. 9.
Figure 11:
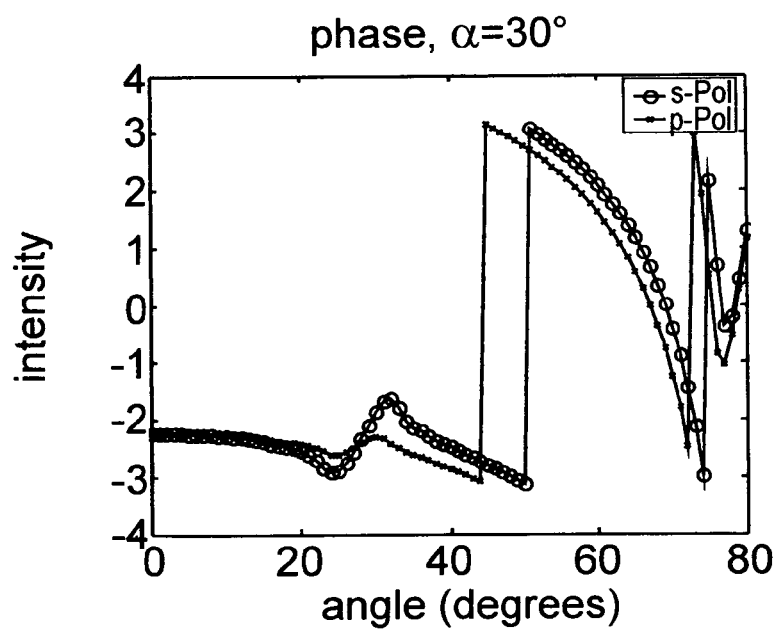
FIG. 11 is a diagram showing the angular dependency of the phase of the transmitted beam for the fourth embodiment of the polarization-optical element seen in FIG. 9.

FIG. 10 is a diagram showing the angular dependency of the transmitted intensity for the fourth embodiment, seen in FIG. 9, of the polarization-optical element 1. An associated diagram showing the phase of the transmitted beam is illustrated in FIG. 11. The way of illustration corresponds to FIG. 3, with the phase instead of the intensity being plotted on the ordinate in FIG. 11. An incidence angle of α=30° was selected as a parameter for determination of the layer structure.

As seen in FIG. 10, the s-polarized as well as the p-polarized fraction of the transmitted beam has a minimum of intensity in a range just below an angle of 30°. The two minima are differently strong. Outside the range of these minima, the s-polarized and the p-polarized fractions have only slightly varying intensities.

FIG. 11 shows that an angle-dependent difference of phase exists between the s-polarized and the p-polarized fraction of the transmitted beam. Consequently, the difference of phase between the s-polarized and the p-polarized fraction of the transmitted beam depends on the angle to the surface normal by which the incident beam strikes the respective partial surface of the mirror 16. The angle of the incident beam to the surface normal again depends on the angular orientation of the respectively illuminated partial surface. For exploitation of the effect of the angle-dependent phase difference, incidence angles are especially suitable, in the neighborhood of which the intensities of the s-polarized and of the p-polarized fraction of the transmitted beam are approximately equal and constant and the difference of phase between the s-polarized and the p-polarized fraction is sufficiently high and exhibits sufficient angular dependency. If the s-polarized-to the p-polarized-fraction intensity ratio has no substantial importance or if corresponding possibilities of correction are available, values between 0.3 and 3 are acceptable for the intensity ratio. The phase difference between the s-polarized and the p-polarized fraction of the transmitted beam should preferably range between one eighth and seven eighths of the wavelength. In some cases, sufficient effects can be obtained even with phase differences of less than one eighth of the wavelength. In the present embodiment, incidence angles of approximately 20° or approximately 40° are especially suitable. These values of the incidence angle do not relate to the incidence angle α which is used for determination of the layer structure of the mirror 16 and which is 30° in the present embodiment, but to the factual angle of the incident beam to the surface normal of the mirror 16.

Figure 12:
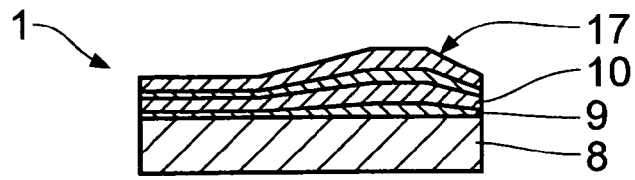
FIG. 12 is a view, corresponding to FIG. 9, of a modification of the fourth embodiment, seen in FIG. 9, of the polarization-optical element.

FIG. 12 is an illustration, corresponding to FIG. 9, of a modification of the fourth embodiment, seen in FIG. 9, of the polarization-optical element 1 according to the invention. In this modification, the mirror 16 with its differently oriented partial surfaces is replaced by a mirror 17 of a layer structure with non-uniform layer thicknesses. By analogy to the mirror 16, the mirror 17 too comprises a silicon substrate 8 to which are applied molybdenum layers 9 and silicon layers 10 in alternate sequence. As opposed to the mirror 16, the silicon substrate 8 is plane in the mirror 17. Moreover, the individual layers 9 and 10 of the mirror 17 do not have a uniform thickness, but vary in thickness within the respective layer 9 and 10, respectively. As with variously oriented partial surfaces, partial surfaces of varying layer structure too can be used to obtain space-variant influence on the difference of phase between the s-polarized and the p-polarized fraction of the light beam. Consequently, a desired distribution of phase difference between the s-polarization and the p-polarization can be produced in the transmitted light beam in this way, too.

It is possible, by means of the above-mentioned exemplary embodiments of the polarization-optical element 1, to have space-variant influence on the amplitude of the individual polarization components and/or the phase difference between the polarization components of a light beam that is spatially extended crosswise of its direction of propagation. Use can be made of this for correction of polarization-dependent imaging errors which occur for example in a projection exposure system for micro-lithography that operates in the EUV region. For example, an s-polarized and a p-polarized point image exhibit a different contrast in the EUV region already in case of a numerical aperture above approximately 0.4. Phase effects can occasion a difference of position between s-polarized and p-polarized point images of approximately 1 nm. In addition to using the polarization-optical element 1 for correction of those errors, there is the possibility to generate polarization states by which to ensure improved imaging. For enabling the polarization-optical element 1 to be adapted subsequently, it can be embodied for simple exchangeability. Also, the polarization-optical element 1 can be equipped with a possibility of adjustment which implements for example a change of angular adjustment of the polarization-optical element 1. However, the polarization-optical element 1 may be used not only for correction of imaging errors, but also for production of a desired polarization state.

Figure 13:
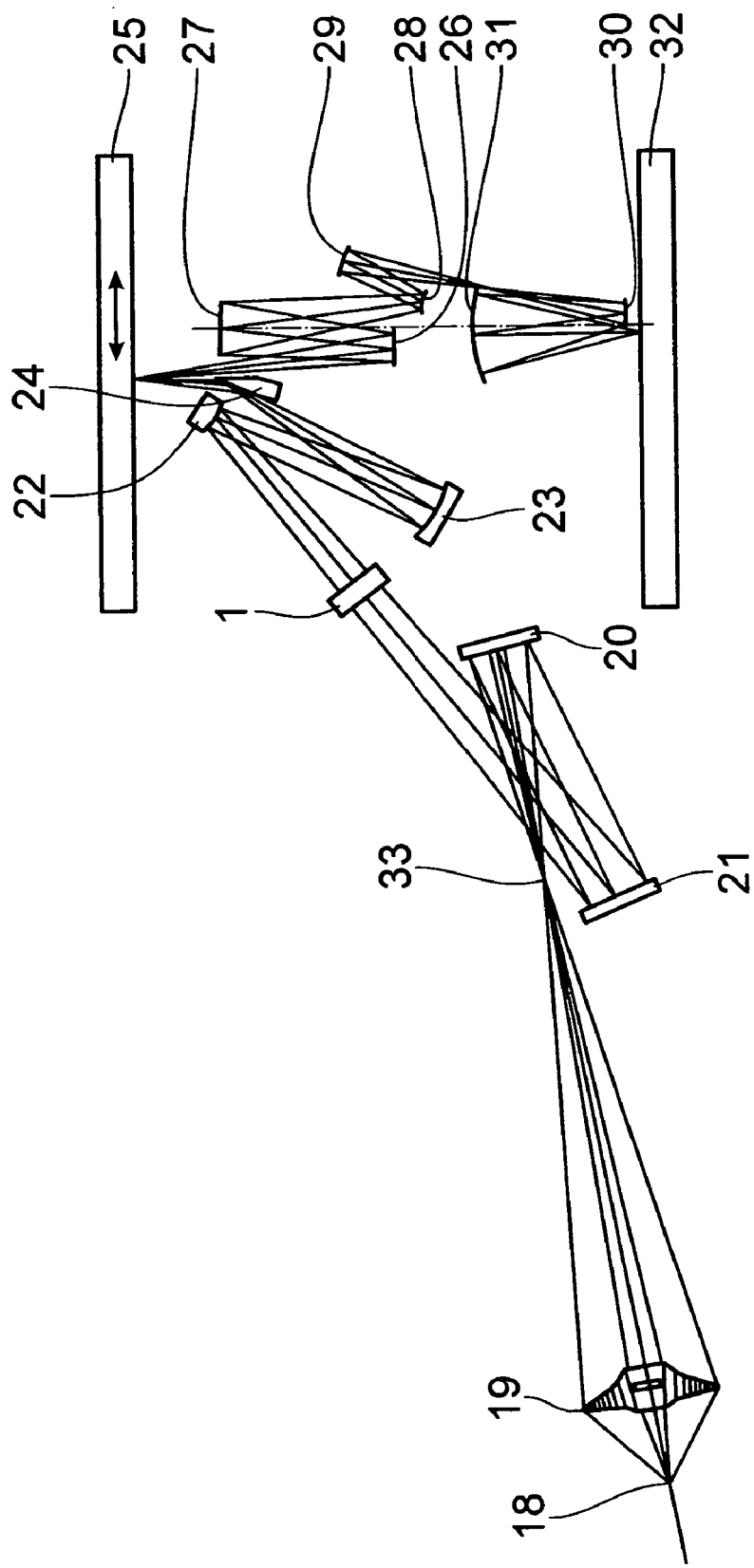
FIG. 13 is a diagrammatic view of an embodiment of a projection exposure system with the polarization-optical element according to the invention.

FIG. 13 is a diagrammatic illustration of an embodiment of a projection exposure system with a polarization-optical element 1 according to the invention. This projection exposure system which is illustrated to scale can for example be used in the manufacture of micro-electronic components and is operated by light in the EUV region for it to be possible to resolve smallest possible structures. Preferably soft X-radiation is used of a wavelength of less than 100 nm. The following description is again based on a wavelength of 13.5 nm.

The light is generated by a light source 18. If polarized light is to be used, a synchrotron may for example be used as a light source 18. A laser plasma source or a plasma discharge source are for example suitable for the production of unpolarized light. A collector 19, illumination optics that consist of five mirrors 20, 21, 22, 23 and 24, a reflecting mask 25, a projection objective that is comprised of six mirrors 26, 27, 28, 29, 30 and 31, and a wafer 32 or any other to-be-illuminated object are disposed one after the other in the beam direction downstream of the light source 18. The distance between the reflecting mask 25 and the wafer 32 is 1,486 m. The distances and orientations of all optical components depicted in FIG. 13 are to scale.

The light generated by the light source 18 is collected by the collector 19, with an intermediate focus 13 of the light source originating downstream of the collector 19. Between the collector 19 and the location of intermediate focus, a spectral filter may be disposed which is not shown in the figure. The collector 19 can be constructed as described in US 2003-0043455 A1, having a plurality of rotationally symmetrical, concave mirrors. The disclosure of US 2003-0043455 A1 is integrated to its full extent into the present application.

The illumination system must ensure as optimal as possible an illumination of the mask 25. An illumination system of the species is described in detail in U.S. Pat. No. 6,438,199 B1, the disclosure of which is integrated to its full extent into the present application. The first mirror 20 of the illumination system, which is disposed on the beam path downstream of the intermediate focus 33 of the light source 18, comprises a plurality of screen elements of facets, also called field honeycombs, and produces a plurality of secondary light sources in the vicinity of the subsequent mirror 21. The mirror 21 also comprises a plurality of screen elements or facets, also called pupil honeycombs. The polarization-optical element 1 according to the invention is disposed between the mirrors 21 and 22. In the illustrated embodiment of the projection exposure system, sufficient construction space is available in this area. Moreover, this area excels by comparatively low beam divergence. However, the polarization-optical element 1 can just as well be located somewhere else in the illumination system, for example between the mirrors 20 and 21 or also in the projection objective. Generally, the polarization-optical element 1 is preferably disposed in a pupil range for field variations to be avoided. If, by contrast, field variations are desired, the polarization-optical element 1 will be disposed outside the pupil. The mirrors 22, 23 and 24 match the exit pupil of the illumination system to the entrance pupil of the projection objective and illuminate the mask 25 by an annular field. For a desired area of the mask 25 to be illuminated, the mask is moved crosswise of the beam direction. If the polarization-optical element 1 is used for polarization of the light i.e., for generation of a desired polarization state, in the embodiment shown, then the mask 25 is illuminated by polarized light. Modified positioning of the polarization-optical element 1 also offers the possibility to operate another portion of the projection exposure system by polarized light.

The mask 25, which is illuminated by the illumination system, is imaged on the wafer 32 by the projection objective, whereby a light-sensitive coating is illuminated that is applied to the wafer 32. A projection objective of the species is described in detail in U.S. Pat. No. 6,353,470, the disclosure of which is integrated to its full extent into the present application. For imaging as optimal as possible, the mirrors 26, 27, 28, 29, 30 and 31 of the projection objective are preferably aspherical.

After illumination of the wafer 32 by the projection exposure system, the wafer 32 is subjected to treatment, based on the structures produced by the illumination, after which another illumination and, based thereon, further treatment may take place. This procedure is repeated until the wafer 32 exhibits all the desired structures.

The invention claimed is:

1. A projection exposure system, comprising:
a light source configured to produce light in the EUV region;
a first optical system configured to illuminate a mask by the light of the light source; and a second optical system configured to image the mask on a structural member; wherein at least one polarization-optical element for the EUV region is disposed in a beam path between the light source and the structural member,
the at least one polarization-optical element comprises a substrate being at least partially transparent for a first polarization state of the EUV light being incident under a given angle of inclination $\alpha$,
the at least one polarization-optical element comprises a layer structure which is arranged on the substrate and which is reflective for a second polarization state of the EUV light, and the projection exposure system is microlithography projection exposure system, wherein the layer structure comprises alternately successive molybdenum layers and silicon layers.

2. The projection exposure system according to claim 1, wherein the substrate and the layer structure of the polarization-optical element are arranged such that they have their transparent and reflective optical effect at an angle of inclination $\alpha$ of the EUV light of approximately 45°.

3. The projection exposure system according to claim 1, wherein the substrate has a thickness of less than 1 μm.

4. The projection exposure system according to claim 3, wherein the substrate of the polarization-optical element is disposed on a regionally perforated carrier structure of higher mechanical stability than the substrate.

5. The projection exposure system according to claim 1, wherein the layer structure has a plurality of alternatively successive layers.

6. The projection exposure system according to claim 5, wherein the polarization-optical element comprises less than 80 alternately successive layers.

7. The projection exposure system according to claim 6, wherein the polarization-optical element comprises approximately 40 alternately successive layers.

8. The projection exposure system according to claim 1, wherein the layer thickness of the molybdenum layers of the polarization-optical element is 2.478 nm/cos $\alpha$, and wherein the layer thickness of the silicon layers of the polarization-optical element is 4.406 nm/cos $\alpha$.

9. The projection exposure system according to claim 1, wherein the polarization-optical element is arranged such that the intensity of the transmitted fraction of the EUV light amounts to at least 10% of the intensity of the reflected fraction.

10. The projection exposure system according to claim 9, wherein the polarization-optical element is arranged such that the intensity of the transmitted fraction of the EUV light amounts to at least 15% of the intensity of the reflected fraction.

11. The projection exposure system according to claim 10, wherein the polarization-optical element is arranged such that the intensity of the transmitted fraction of the EUV light amounts to at least 20% of the intensity of the reflected fraction.

12. The projection exposure system according to claim 1, wherein the layer structure of the polarization-optical element has at least one non-uniform thick layer, or wherein at least one of the layers of the layer structure has a surface that is exposed to the EUV light beam, which surface comprises several partial surfaces which are inclined to each other.

* * * * *

UNITED STATES PATENT AND TRADEMARK OFFICE
CERTIFICATE OF CORRECTION

| | | |
|---|---|---|
| PATENT NO. | : 7,982,854 B2 | Page 1 of 1 |
| APPLICATION NO. | : 11/911454 | |
| DATED | : July 19, 2011 | |
| INVENTOR(S) | : Hans-Juergen Mann et al. | |

It is certified that error appears in the above-identified patent and that said Letters Patent is hereby corrected as shown below:

Column 4, line 40, delete "mm/cos α" insert --nm/cos α--

Signed and Sealed this
Eighth Day of November, 2011

David J. Kappos
*Director of the United States Patent and Trademark Office*